United States Patent [19]

Chester

[11] Patent Number: 5,717,617
[45] Date of Patent: Feb. 10, 1998

[54] RATE CHANGE FILTER AND METHOD

[75] Inventor: David Bruce Chester, Palm Bay, Fla.

[73] Assignee: Harris Corporation, Melbourne, Fla.

[21] Appl. No.: 440,707

[22] Filed: May 15, 1995

Related U.S. Application Data

[63] Continuation-in-part of Ser. No. 48,992, Apr. 16, 1993, abandoned.

[51] Int. Cl.⁶ .................................................. G06F 17/17
[52] U.S. Cl. .................................................. 364/724.1
[58] Field of Search ........................................ 364/724.1

[56] References Cited

U.S. PATENT DOCUMENTS

| | | | |
|---|---|---|---|
| 4,674,125 | 6/1987 | Carlson et al. | 364/724.1 |
| 4,694,413 | 9/1987 | Arbeiter | 364/724.1 |
| 4,718,104 | 1/1988 | Anderson | 364/724.1 |
| 4,725,972 | 2/1988 | Göckler | 364/724.1 |
| 4,748,578 | 5/1988 | Lagadec et al. | 364/724.1 |
| 4,799,179 | 1/1989 | Masson et al. | 364/724.1 |
| 4,817,182 | 3/1989 | Adelson et al. | 364/724.1 |
| 4,896,320 | 1/1990 | Göckler | 364/724.1 |
| 4,918,524 | 4/1990 | Ansari et al. | 364/724.1 |
| 5,177,700 | 1/1993 | Göckler | 364/724.1 |
| 5,204,827 | 4/1993 | Fujita et al. | 364/724.1 |

OTHER PUBLICATIONS

Crochiere et al., "Optimum FIR Digital Filter Implementations for Decimation, Interpolation, and Narrow–Band Filtering", IEEE Trans. on Acoustics, Speech and Signal Processing, vol. ASSP–23, No. 5, Oct. 1975, pp. 444–456.

*Primary Examiner*—Tan V. Mai
*Attorney, Agent, or Firm*—Rogers & Killeen

[57] ABSTRACT

A digital rate change filter with multiple stages and including sampling rate compression and following offsetting expansion about a lowpass filter. Phantom decimation and interpolation rates are used as approximates to actual rates, the phantom rates allow near optimal factoring into rates for two-stage filters, and linkage of these factors to actual rates are efficiently made.

21 Claims, 14 Drawing Sheets

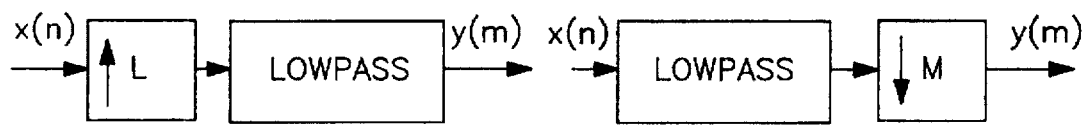
FIG. 2A
PRIOR ART
FIG. 2B
PRIOR ART
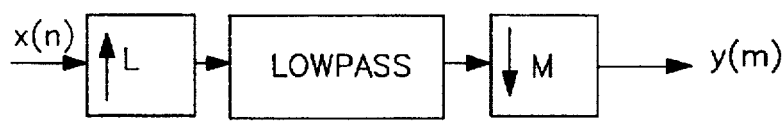
FIG. 2C
PRIOR ART
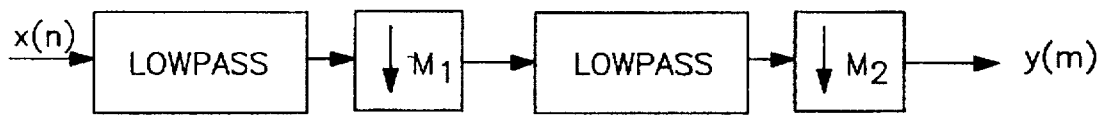
FIG. 2D
PRIOR ART
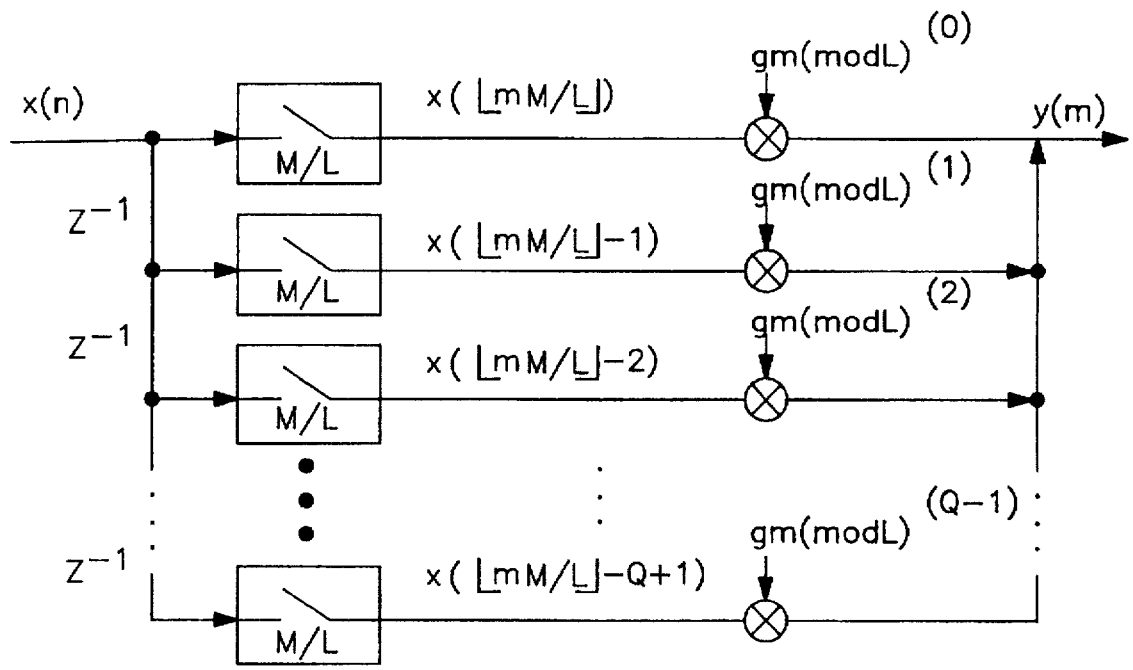
FIG. 3
PRIOR ART

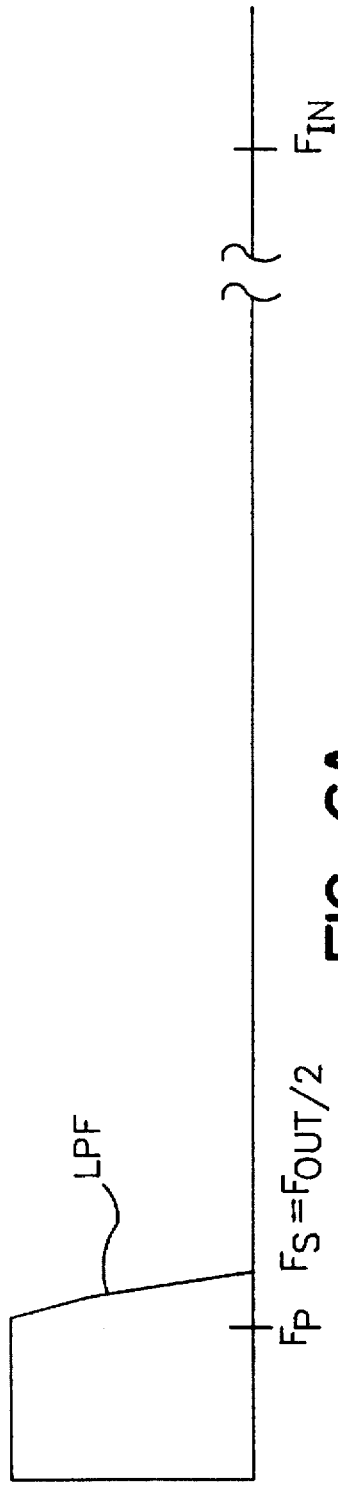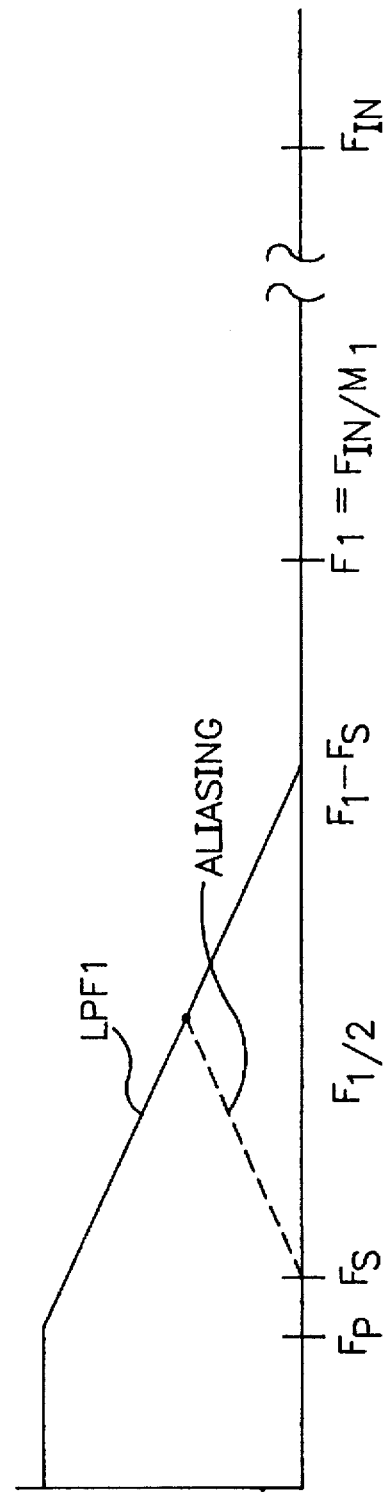

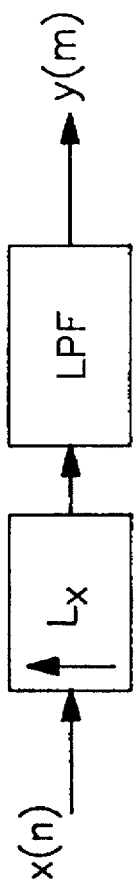
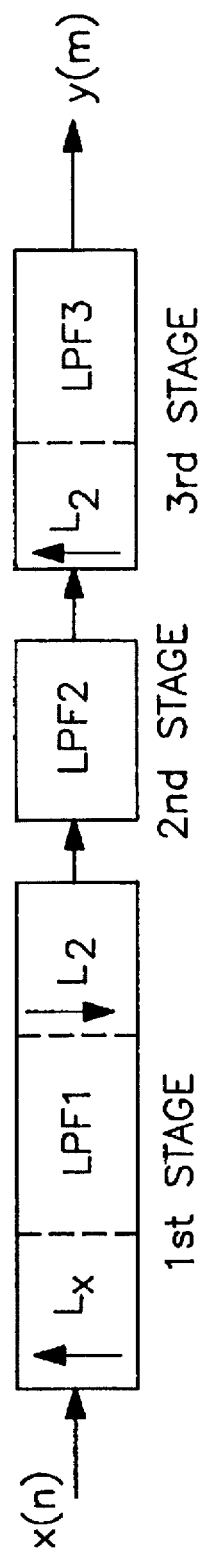
FIG. 7A PRIOR ART
FIG. 7B

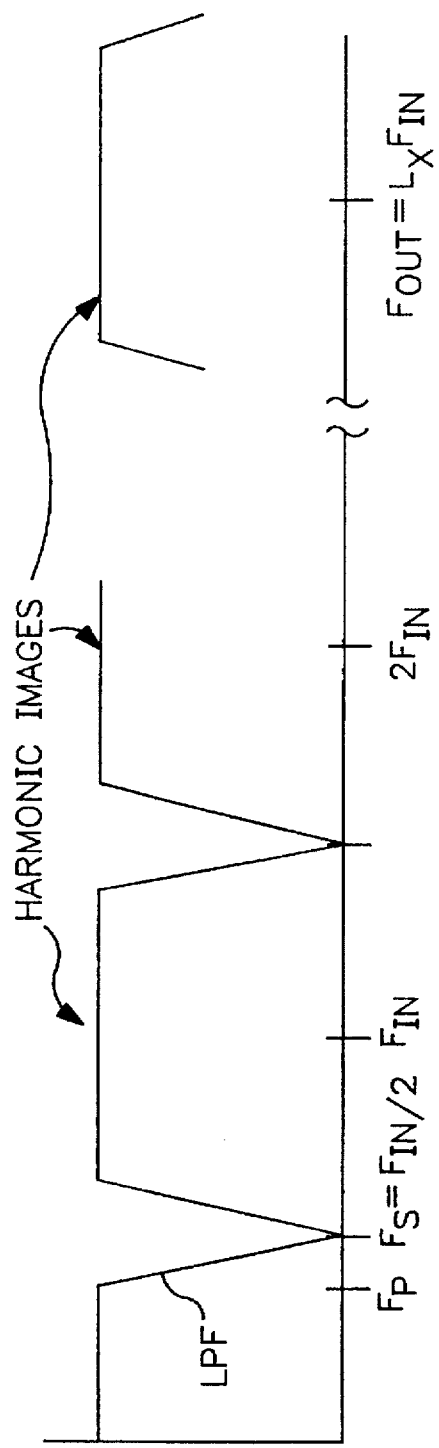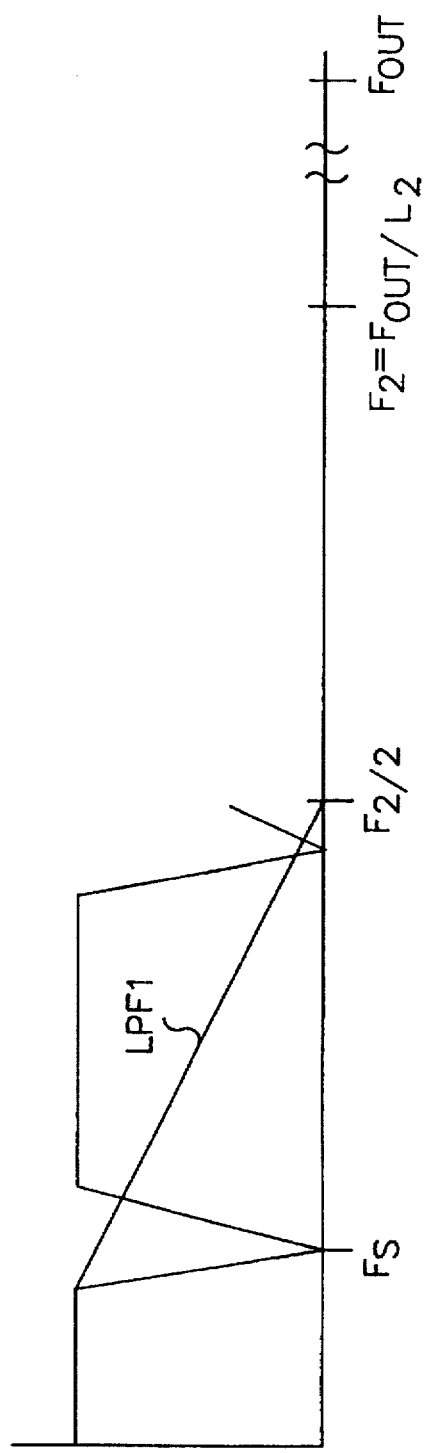
FIG. 8A
FIG. 8B

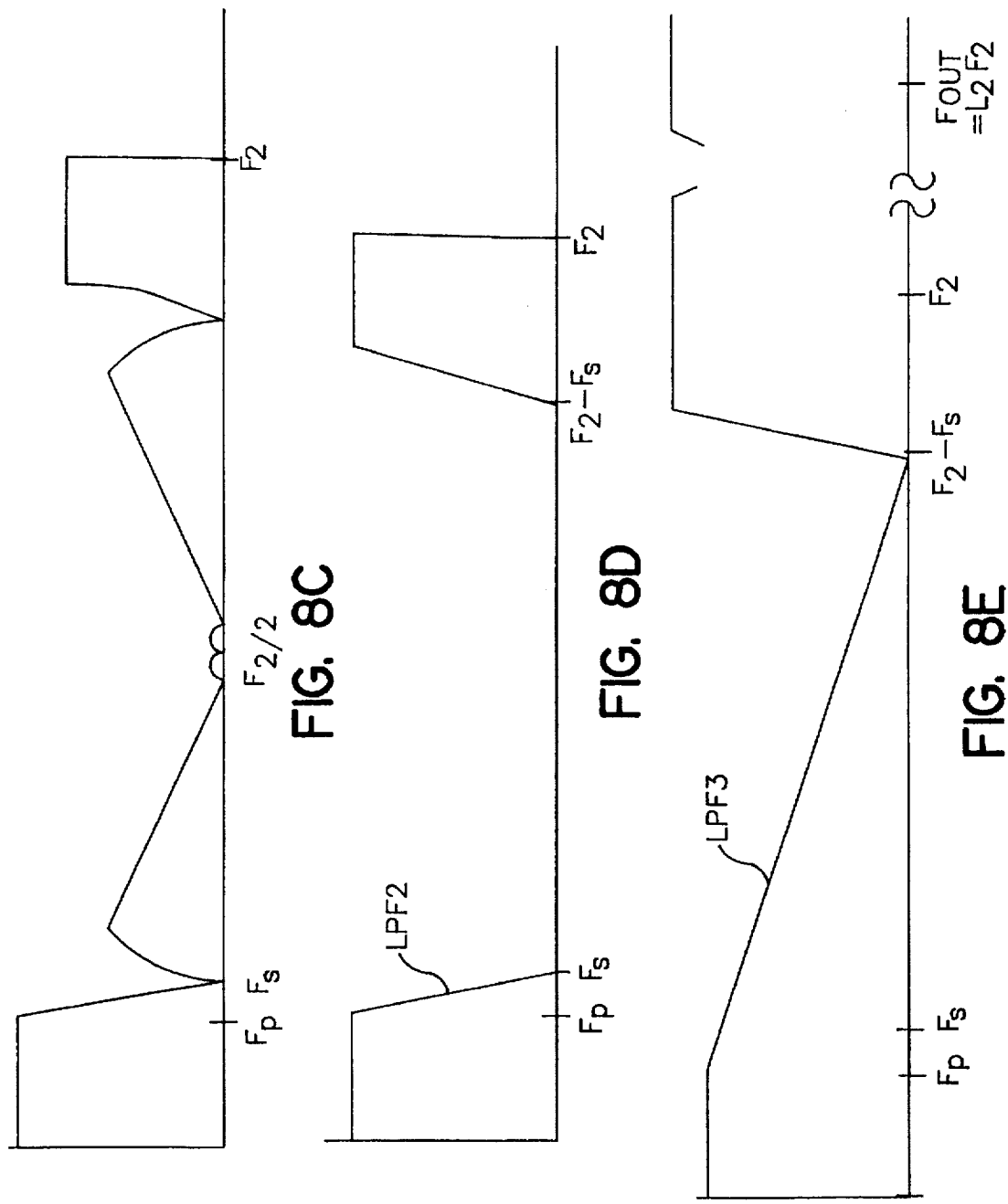

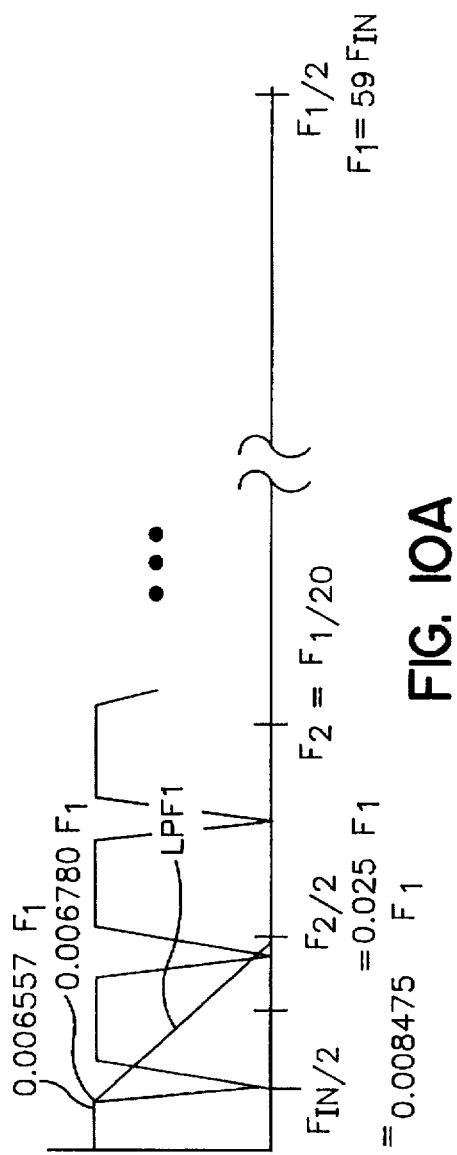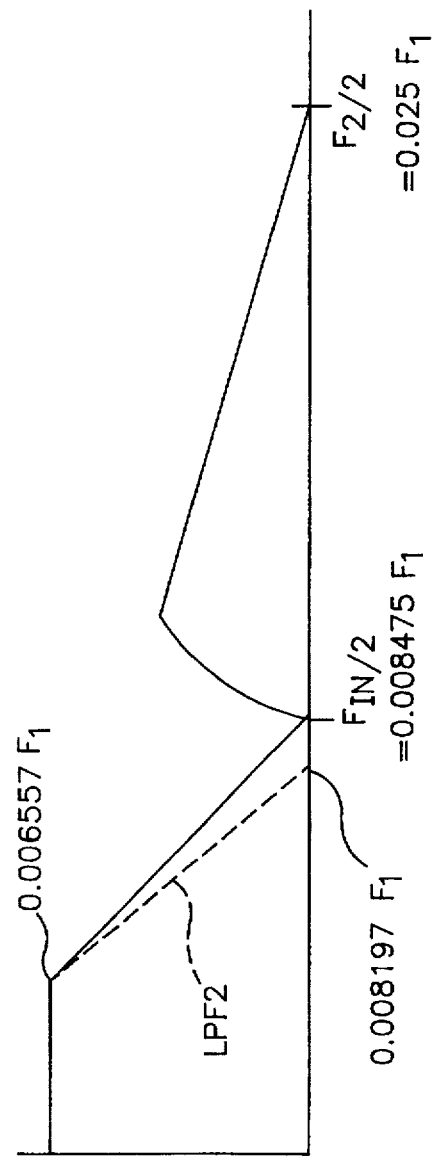

RATE CHANGE FILTER AND METHOD

This is a continuation-in-part of application Ser. No. 08/048,992 filed Apr. 16, 1993, now abandoned.

CROSS-REFERENCE TO RELATED APPLICATIONS

The following U.S. patent application is assigned to the assigned of this application and discloses related subject matter: Ser. No. 07/930,169, filed Aug. 14, 1992 (Young and Chester, "Decimation Filter and Method"), U.S. Pat. No. 5,455,782.

BACKGROUND AND SUMMARY OF THE INVENTIONS

The present invention relates to digital signal processing, and, more particularly, to semiconductor circuits and methods useful for digital filters which change sampling rates of digital data streams.

Digital Systems

The advent of integrated circuit (cheap) analog-to-digital (A/D) converters, digital-to-analog converters (DACs), and digital signal processing circuits has expanded the applications of digital signal processing into diverse fields such as communications and high fidelity audio systems. Common problems in such fields include sampling rate conversions for digital data streams. For example, extraction of a desired band from a frequency multiplexed broadcast signal will typically yield a highly oversampled signal, and sampling rate reduction permits simpler hardware for subsequent processing. Similarly, the conversion between time division multiplexed (TDM) format and frequency division multiplexed (FDM) format includes a sampling rate change. FIG. 1 illustrates the frequency band changes for TDM-FDM conversion, and this implies sampling rate changes due to the Nyquist theorem.

Traditionally, digital filtering with low decimation (sampling rate reduction) and interpolation (sampling rate increase) rates have been implemented in a single stage finite impulse response (FIR) filter which includes stored filter coefficients and a multiplier plus accumulator for performing the multiply-and-add filter computations. Likewise, for high decimation or interpolation rates, multiplier-free filter architectures have been developed. Intermediate decimation and interpolation rates present problems because the single stage FIR filter has too many computations and multiplier-free architectures have poor performance. However, various intermediate rate filters have been realized using multistage FIR filters, although in general intermediate rate filters cannot be efficiently implemented in this manner.

Crochiere and Rabiner, Multirate Digital Signal Processing (Prentice-Hall 1983) provides general information regarding signal processing using sampling rate changes and describes filter architectures and analysis of implementation efficiency. In particular, integer decimation rates merely amount to subsampling and integer interpolation rates consist of inserting extra samples taken to be 0 and then lowpass filtering to fill in values for inserted 0s. A lowpass filter preceding a decimation prevents the aliasing which otherwise would occur due to the sampling rate reduction. Then a rational number decimation or interpolation rate can be realized by first integer interpolation by the rational number's numerator followed by integer decimation by the rational number's denominator. FIG. 2a heuristically represents an interpolation filter with integer rate L, FIG. 2b a decimation filter with integer rate M, FIG. 2c a cascade to obtain an overall rate change of L/M, and FIG. 2d a two-stage decimation filter. In the two-stage filter of FIG. 2d the overall decimation rate is simply the product of the individual stage's decimation rates.

Hogenauer, An Economical Class of Digital Filters for Decimation and Interpolation, 29 IEEE Tr.Ac.Sp.Sig.Proc. 155 (1981) discusses multiplier-free filters for high decimation and interpolation rate filters.

However, the traditional multistage approach used for intermediate decimation and interpolation rates (roughly from 8 to 64) requires the rates be composite numbers (the product of factors) with one filter stage providing one decimation or interpolation rate factor. Thus an overall decimation or interpolation rate which is a prime number or which equals the product of inconvenient factors presents problems for efficient implementation with traditional approaches.

Features

The present invention provides a digital filter architecture for intermediate (roughly from 8 to 64) decimation or interpolation rates and also for rates which are rational numbers with both numerator and denominator of intermediate size. This architecture effectively cascades filter blocks with each block an efficiently-implemented combination of interpolation, lowpass filter, and decimation. The sampling rate has successive offsetting expansions and compressions within the filter in contrast to typical multistage digital filters which have a series of rate expansion stages followed by a series of rate compression stages. The choices of individual decimation and interpolation rates within the blocks depends upon approximate optimal size factoring of the overall interpolation and decimation rates. Some of the individual rates may be equal to 1 and thus not explicit. This cascade permits linking of overall rates which do not factor into near optimal rates into the approximate optimal rates.

BRIEF DESCRIPTION OF THE DRAWINGS

The present invention will be described with reference to the accompanying drawings, which are schematic for clarity:

FIGS. 2a–d show representation of known filters;

FIG. 3 shows an implementation of a known filter;

FIGS. 6a–c illustrate the filtering steps of the embodiment of FIG. 5b;

FIGS. 7a–b compare a preferred embodiment and a known interpolation filter;

FIGS. 8a–e illustrate the filtering steps of the embodiment of FIG. 7b;

FIGS. 10a–d illustrate the filtering steps leading to another embodiment; and

DESCRIPTION OF THE PREFERRED EMBODIMENTS

Overview

Figure 1:
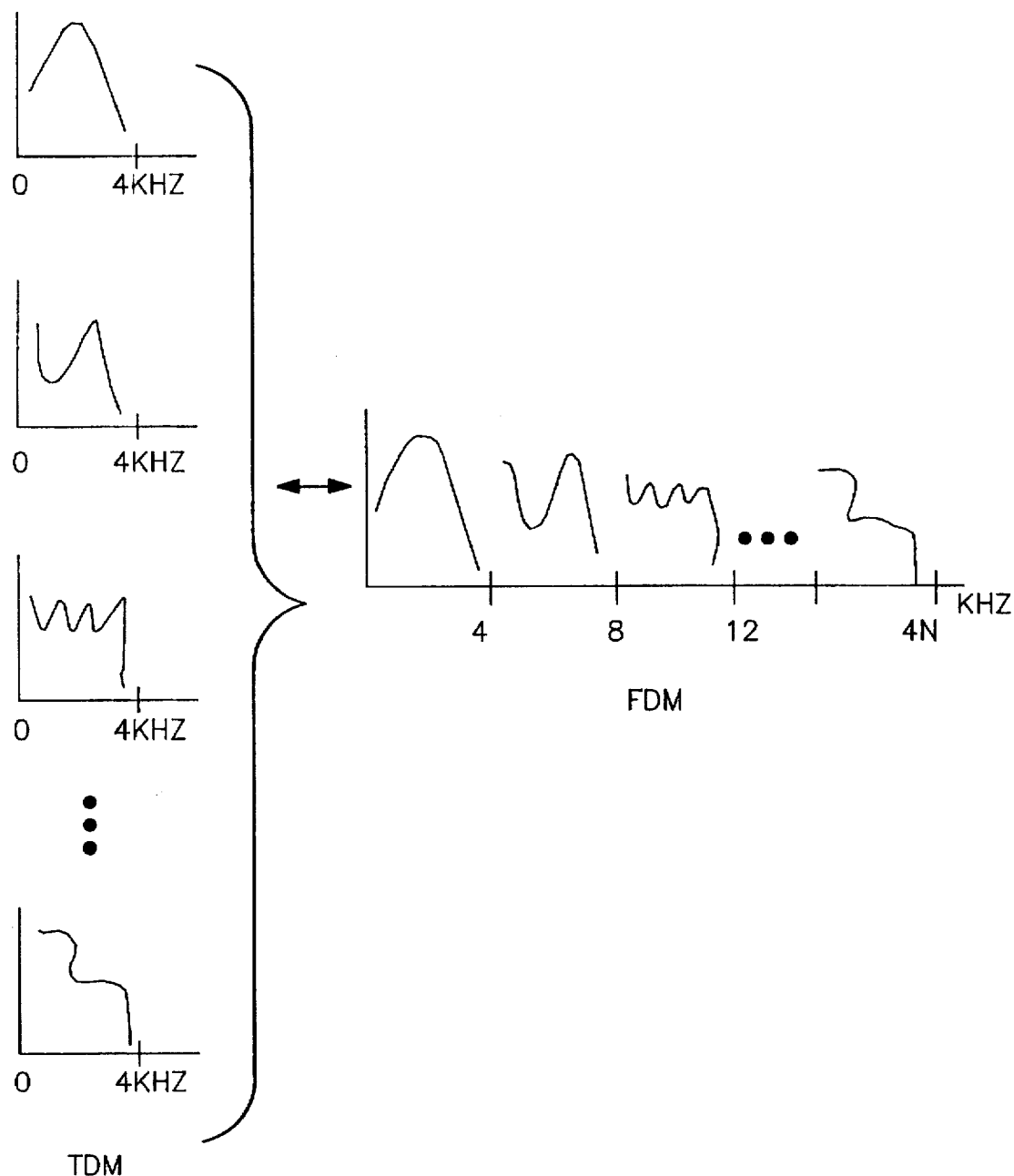
FIG. 1 illustrates TDM-FDM conversion.
Figure 4A:
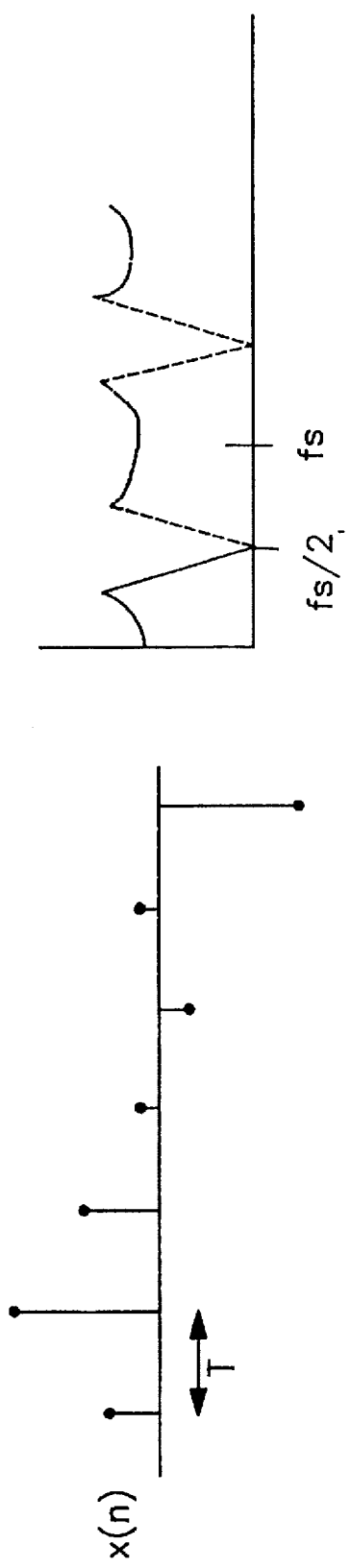
FIGS. 4a–d illustrate filtering steps.
Figure 4B:
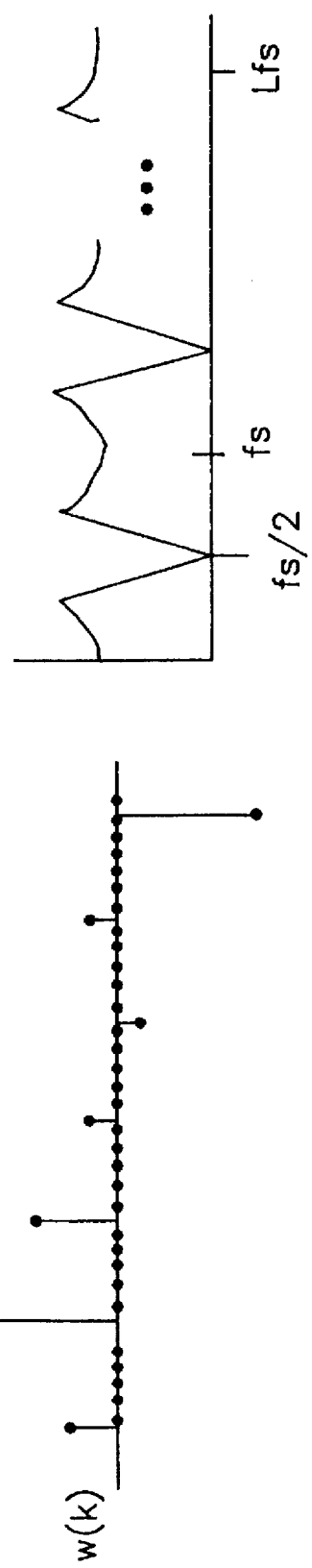
Figure 4C:
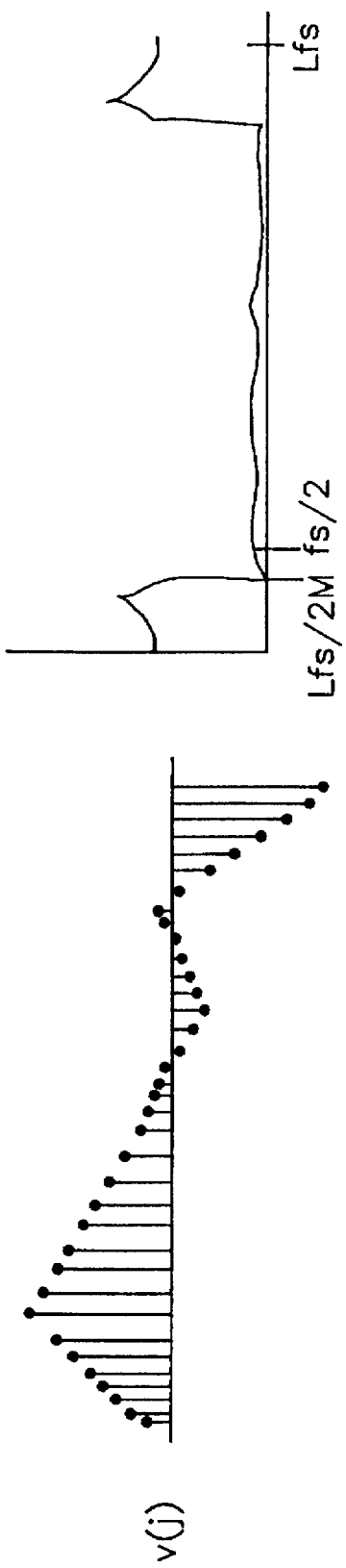
Figure 4D:
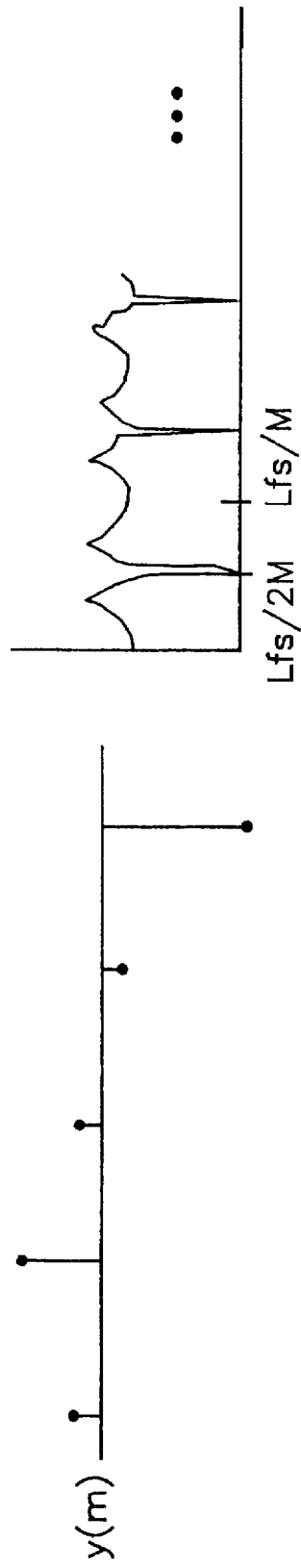

Heuristically, the preferred embodiment rate change filters cascade L/M sampling rate converters (L and M integers) schematically illustrated in FIG. 2c with appropriate selections of the Ls and Ms to handle overall interpolation or decimation rates of integer intermediate size (roughly from 8 to 64) and fractions with numerator and denominator of intermediate size. As Crochiere and Rabiner (section 3.3.4) show, the converter of FIG. 2c can be efficiently implemented with the hardware shown in FIG. 3 when the filter has length QL with Q an integer. Note that "efficiently" means with computations near the minimum number of mulitplies and adds required by the lowpass filter; the sampling rite expansion (adding L-1 0s between successive samples) and sampling rate compression (picking every Mth sample) do not require computations.

With an awkward intermediate overall decimation rate, for example a prime like 61, the preferred embodiments choose a convenient composite "phantom" rate, 60 in the example, which has near optimal size factors, for example 20 and 3, and essentially cascades three converters of FIG. 2c with L and M equal to 1 and 20, 1 and 1, and 20 and 61. Note that the "optimal" factoring of the phantom rate depends upon the desired filter characteristics and the optimization may be with respect to the number of multiplies or the storage required; see Crochiere and Rabiner sections 5.3.2–5.3.5. An overall interpolation by 61 would just be the decimation cascade run in reverse. Fractional rate change embodiments may be created by cascading a decimation embodiment with an interpolation embodiment. A detailed explanation follows.

L/M Converter

FIG. 2c represents a sampling rate converter which first expands the sampling rate by an integer L, lowpass filters, and then compresses the sampling rate by an integer M. More explicitly, presume an incoming sample stream $x(n)$ at a sampling frequency of $f_S$; that is, $x(n)$ could be samples of an analog signal $x_A(t)$ at time intervals of size T with T equal to $1/f_S$. In other words, $x(n)=x_A(nT)$. Then the expansion by L converts the sample stream $x(n)$ into sample stream $w(k)$ by inserting L-1 0s between each $x(n)$ sample:

$$w(k)=x(n) \text{ if } k=nL$$

$$0 \text{ if } k \neq nL$$

This insertion of 0s thus expands the sampling frequency to $Lf_S$ and also introduces high frequency harmonic images to be filtered out by the lowpass filter. Indeed, the Nyquist sampling theorem implies that the information about $x_A(t)$ in $x(n)$ only includes frequencies up to $f_S/2$, but the harmonic images (the converse of aliases) are realized by the expansion of the sampling rate. Thus energy at these image frequencies must be eliminated by the lowpass filter. The lowpass filter must also eliminate energy at frequencies which would alias into the lower frequencies due to the following sampling rate compression by M. Let $h(k)$ denote the impulse response of the lowpass FIR filter; thus the output of the lowpass filter, $v(j)$, would be:

$$v(j)=\Sigma w(j-k)h(k)$$

The final sampling rate compression by M to convert $v(j)$ into output $y(m)$ just selects every Mth sample:

$$y(m)=v(Mm)$$

FIGS. 4a–d heuristically illustrate the sample streams and corresponding frequency spectra for the case of M greater than L, so the lowpass filter cuts off at $Lf_S/2M$.

Crochiere and Rabiner section 3.3.4 shows an efficient implementation of the FIG. 2c converter with the presumption that the order of the lowpass filter equals QL for some integer Q. In particular, $y(m)$ may be expressed in the form:

$$y(m)=\Sigma g_m(n)x(\lfloor mM/L \rfloor - n), -\infty < n < \infty$$

where $g_m(n)$ equals $h(nL+mM(\bmod L))$ and $\lfloor mM/L \rfloor$ means the integral portion of $mM/L$. Then the presumption of the filter order being Q times L leads to each filter coefficient set $g_m(.)$ having only Q nonzero term. Furthermore, $g_m(n)$ is periodic in m with period L, so the expression for $y(m)$ becomes:

$$y(m)=\Sigma g_{m(\bmod L)}(n)x(\lfloor mM/L \rfloor - n), 0 \leq n \leq Q-1$$

This shows that $y(m)$ output samples are computed as a weighted sum of Q sequential samples of $x(n)$ starting at the $x(\lfloor mM/L \rfloor)$ sample and going backwards in n sequentially. The weighting coefficients periodically time vary so the coefficient set $g_{m(\bmod L)}(n)$ for $0 \leq n \leq Q-1$ is used for the mth output sample.

Thus the structure of FIG. 3 provides an efficient inplementation because the filtering operation occurs at the output sampling rate with the minimum requried number of coefficients used to generate each output. Indeed, the FIG. 3 structure consists of a Q-sample "shift register" operating at the input sampling rate, a Q-tap FIR structure with time-varying coefficients which operates at the output sampling rate, and a series of digital "hold-and-sample" boxes that couple the input and output sampling rates. The boxes input sides hold the most recent input value until the next input value comes along, and the boxes output sides sample the input values at times $n=mM/L$.

Decimation Embodiment

Figure 5A:
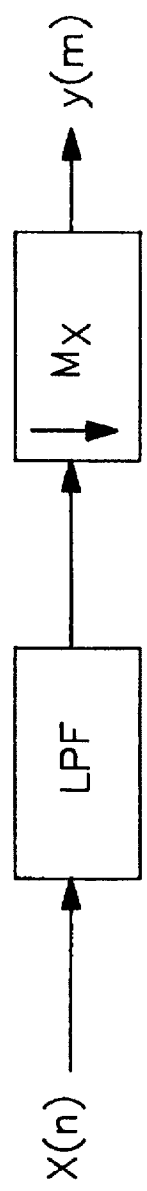
FIGS. 5a–b compare a preferred embodiment and a known decimation filter.
Figure 5B:
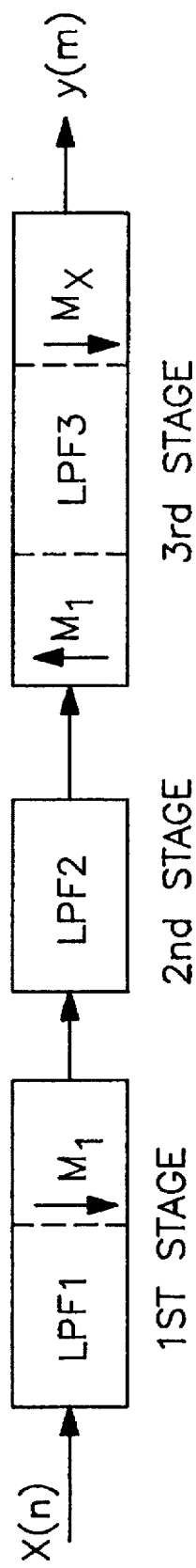

FIG. 5a illustrates a single stage filter with integer decimation rate $M_X$ and FIG. 5b shows a corresponding preferred embodiment rate change filter for decimation. The choice of the parameters in the embodiment of FIG. 5b proceeds as follows. First, the shape of the lowpass filter LPF of FIG. 5a defines the parameter $\Delta f=(F_S-F_P)/F_S$ where $F_S$ is the frequency of the lower edge of the stopband of filter LPF and $F_P$ is the frequency of upper edge of the passband. FIG. 6a illustrates the frequency response of filter LPF.

Second, select a phantom integer compression rate M which is close to $M_X$ and which factors into $M_1$ and $M_2$ which are near optimal with respect to number of filter multiplications needed; Crochiere and Rabiner section 5.3.2 shows that the optimal $M_1$ is given by:

$$\text{optimal } M_1=2M/[(2-\Delta f)+(M\Delta f(2-\Delta f))^{0.5}]$$

The optimal $M_2$ is simply M divided by the optimal $M_1$. The following table lists some decimation rates with their optimal factors for $\Delta F=0.2$ (shape factor 1.25:1) and 0.1 (shape factor 1.11:1):

| | $\Delta f = 0.2$ optimal | | Actual | | $\Delta f = 0.1$ optimal | | Actual | |
|---|---|---|---|---|---|---|---|---|
| M | $M_1$ | $M_2$ | $M_1$ | $M_2$ | $M_1$ | $M_2$ | $M_1$ | $M_2$ |
| 10 | 5.41 | 1.85 | 5 | 2 | 6.11 | 1.64 | 5 | 2 |
| 20 | 8.92 | 2.24 | 10 | 2 | 10.41 | 1.92 | 10 | 2 |
| 30 | 11.80 | 2.54 | 10 | 3 | 14.02 | 2.14 | 15 | 2 |
| 42 | 14.77 | 2.84 | 14 | 3 | 17.82 | 2.36 | 21 | 2 |

-continued

| | Δf = 0.2 optimal | | Actual | | Δf = 0.1 optimal | | Actual | |
|---|---|---|---|---|---|---|---|---|
| M | $M_1$ | $M_2$ | $M_1$ | $M_2$ | $M_1$ | $M_2$ | $M_1$ | $M_2$ |
| 51 | 16.76 | 3.04 | 17 | 3 | 20.40 | 2.50 | 17 | 3 |
| 60 | 18.61 | 3.22 | 20 | 3 | 22.80 | 2.63 | 20 | 3 |
| 72 | 20.90 | 3.45 | 24 | 3 | 25.78 | 2.79 | 24 | 3 |

The list shows that for these filter shape factors an intermediate rate $M_X$ always has a phantom rate which is either a multiple of 2 or a multiple of 3. Thus there is always a phantom rate M within 1 or 2 of $M_X$; indeed, the phantom rate M is generally taken as less than or equal to $M_X$ although it could be taken to be greater than $M_X$ with a possible loss of efficiency.

Third, design the lowpass filter LPF1 of the first stage with passband ripple and stopband attenuation compatible with those of lowpass filter LPF and with the same passband as LPF and with stopband determined by aliasing due to the $M_1$ rate compression falling in the stopband of lowpass filter LPF. In particular, FIG. 6a illustrates the frequency response of lowpass filter LPF which presumably has $F_S$ equal to $F_{OUT}/2$ where $F_{OUT}$ is the output sampling rate and equals $F_{IN}/M_X$ with $F_{IN}$ the input sampling rate; this stopband precludes any aliasing into the baseband (passband plus transition band) by the rate compression by $M_X$. FIG. 6b shows the frequency response of LPF1 which has the same passband as LPF and a transition band extending up to $F_1-F_S$ where $F_1$ is the input sampling rate compressed by $M_1$; that is, $F_1$ equals $F_{IN}/M_1$. This implies that the aliasing from the rate compression by $M_1$ will fall in the stopband as illustrated. Of course, in general one could allow aliasing in the final transition band at the possible cost of performance.

Fourth, design lowpass filter LPF2 of the second stage with the same passband and stopband frequencies as LPF and compatible ripple and attenuation. Of course, LPF2 operates with an input sampling rate of $F_1$ rather than $F_{IN}$, so LPF2 involves fewer computations than LPF despite having the same passband and stopband. LPF2 eliminates the aliased portion of the output from the rate compression by $M_1$ of the first stage.

Figure 6C:
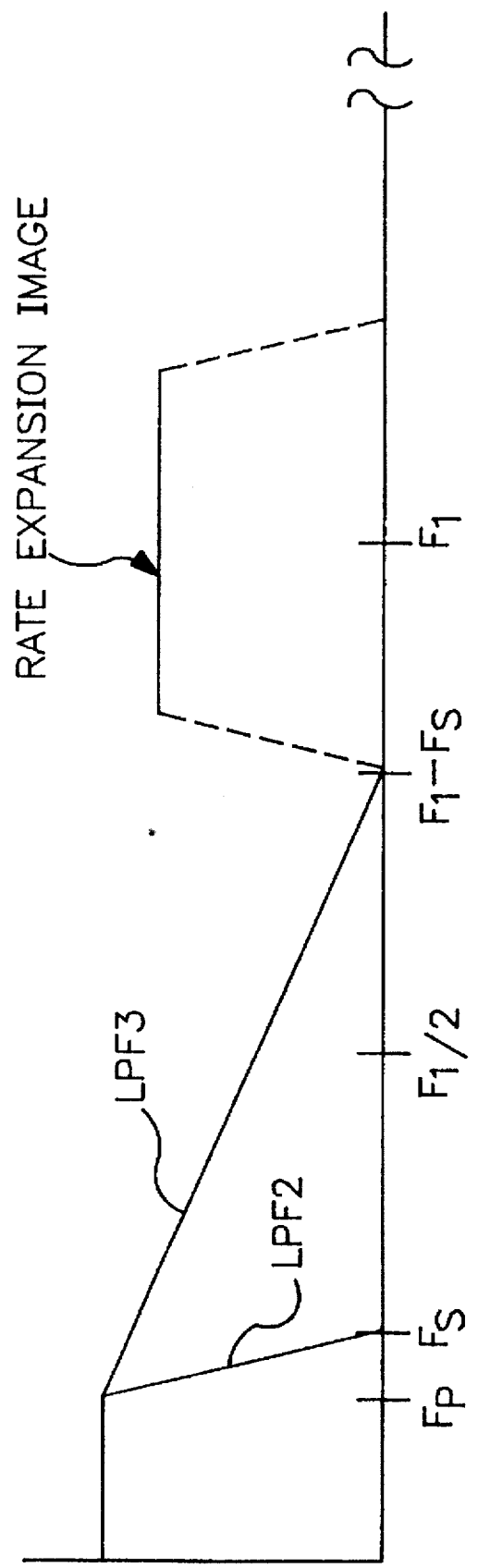

Fifth, design lowpass filter LPF3 of the third stage with ripple and attenuation compatible to that of the lowpass filter LPF and with the same passband as LPF and a stopband that eliminates the harmonic images resulting from the rate expansion by $M_1$. In many cases this is the same filter response as that of LPF1. LPF3 expands the decimated sample-rate by $M_1$ to the original sample rate. It removes the resulting harmonic images and then compresses the sample rate by $M_X$ to the desired output sample rate. FIG. 6c shows the frequency response of both LPF2 and LPF3 and the first of the harmonic images.

This completes a preferred embodiment design. As an illustration of the preferred embodiment, consider the case of $M_X$ equal to 61 with a filter shape factor of 1.2.5:1 (Δf=0.2) and a 80 dB stopband attenuation and 0.00087 dB passband ripple. Thus with a normalized input sampling rate ($F_{IN}$) of 1 Hz, $F_{OUT}$ equals 0.016393 (1/61) Hz and so $F_S$ equals 0.008197 (1/122) Hz and $F_P$ equals 0.006557 (4/5 of $F_S$) Hz. Select a phantom rate M equal to 60 with $M_1$ equal to 20 and $M_2$ equal to 3. Thus $F_1$ equals 0.05 Hz and the transition band of LPF1 extends from 0.006557 Hz to 0.041803 Hz. The single stage implementation of FIG. 5a would have filter LPF with about 2500 taps and, allowing for symmetric calculations, approximately 20 multiplies per second (1 Hz normalized input sampling rate). In contrast, the three stage implementation of the preferred embodiment has lowpass filter LPF1 with 128 taps and approximately 7 multiplies per second (symmetry not included), lowpass filter LPF2 with about 140 taps and approximately 0.1 multiply per second, and lowpass filter LPF3 with 128 taps and approximately 7 multiplies per second. This aggregates to about 400 taps and 14 multiplies per second. Hence, the preferred embodiment has a computational efficiency of roughly 3 to 2 and a storage efficiency of roughly 6.25 to 1 as compared to the single stage implementation. Note that LPF1 and LPF3 operate at the input sampling rate as does LPF, but LPF1 and LPF3 have a much lower number of taps because they have a large transition band, whereas LPF2 has the same transition band as LPF but LPF2 operates at only $1/M_1$ of the input sampling rate. In effect, the preferred embodiment provides the same narrow transition band filtering at low sampling rates and large transition band filtering at high sampling rates that two-stage filters as shown in FIG. 2d provides, but the preferred embodiment applies to decimation rates which cannot be effectively factored for use in the two-stage filter by use of a phantom rate for the factoring coupled with the efficiency of the FIG. 3 structure to make the link between the desired decimation rate and the phantom rate.

The preferred embodiment three stage implementation provides an efficiency gain in cases when $M_X$ is a prime number or is a composite number, such as 49, with factors not close to the optimal $M_1$ and $M_2$. However, when $M_X$ factors to near optimal $M_1$ and $M_2$, then the standard two-stage implementation of FIG. 2d is typically more efficient than the preferred embodiment.

Interpolation Embodiment

FIG. 7a illustrates a single stage filter with integer interpolation rate $L_X$ and FIG. 7b shows a corresponding preferred embodiment rate change filter. The choice of the parameters in the embodiment of FIG. 7b proceeds analogous to the determinations for the preferred embodiment described in the preceding Decimation Embodiment section because of the dual relationship between interpolation and decimation. Again, the shape of the lowpass filter LPF of FIG. 7a defines the parameter $\Delta f=(F_S-F_P)/F_S$ where $F_S$ is the frequency of the lower edge of the stopband of LPF and $F_P$ is the frequency of upper edge of the passband. FIG. 8a shows the frequency response of filter LPF and harmonic images resulting from the sampling rate expansion.

Second, select a phantom integer expansion rate L which is close to $L_X$ and factors into near optimal $L_1$ and $L_2$; this will be the same determination as for the phantom compression rate and factors but with $L_2$ the larger factor and $L_1$ the smaller factor due to duality. Thus the output sampling frequency $F_{OUT}$ equals $L_X F_{IN}$ for an input sampling frequency $F_{IN}$. The sampling frequency of the output of the first stage, $F_2$, will then be equal to $F_{OUT}/L_2$. Presumably, $F_S$ equals $F_{IN}/2$ to eliminate images as illustrated in FIG. 8a for the single stage interpolation filter.

The filters LPF1–LPF3 of FIG. 7b will be analogous to those of FIG. 5b in the sense that the high sampling rate filters LPF1 and LPF3 will have wide transition bands and the narrow transition band filter LPF2 will operate at a lower sampling rate. The filters design proceeds as follows. First, LPF1 will have a transition band extending from $F_P$ to a frequency that precludes aliasing, $F_2/2$ in the most restrictive case described here, and a passband ripple and stopband attenuation compatible with that of LPF. Thus LPF1 will eliminate most of the harmonic images from the rate expansion and the subsequent rate compression by $L_2$ (to a sampling rate $F_2$) will not have any aliasing. Indeed, FIG. 8c shows the output after LPF1 and rate compression by $L_2$. Note that an alternative LPF1 could have a transition band extending from $F_P$ to $F_2-F_S$ (analogous to that of LPF1 and LPF3 of FIG. 5b) and it would alias only into the stopband analogous to LPF1 as shown in FIG. 6b.

Lowpass filter LPF2 of FIG. 7b has the same passband ($F_P$) and stopband ($F_S$) as the lowpass filter LPF of the single stage interpolation filter of FIG. 7a. So LPF2 eliminates the remaining harmonic images passed by lowpass filter LPF1 as illustrated in FIG. 8d. Thus the sampling rate expansion by $L_2$ in the third stage results in harmonic images with LPF2 stopband separations as shown in FIG. 8e. Then LPF3 need only eliminate these separated images and has a transition band from $F_P$ to $F_2-F_S$.

A numerical example will help illustrate the interpolation embodiment. Presume an interpolation filter with a sampling rate expansion $L_X$ of 31 and a lowpass filter with $\Delta f=0.2$. $F_{OUT}=31\ F_{IN}$ and again presume the maximal stopband $F_S=F_{IN}/2$. Take a normalized output sampling rate of 1 Hz; then $F_{IN}$ equals 0.03226 Hz, $F_S$ equals 0.01613 Hz, and $F_P$ equals 0.01290 Hz. A phantom rate L of 30 will have near optimal factors $L_1=3$ and $L_2=10$. LPF1 then has a transition band extending from 0.01290 Hz to 0.05 Hz because $F_2=F_{OUT}/L_2=0.1$ Hz. Lowpass filter LPF2 again has the same passband and transition band as LPF. Lastly, lowpass filter LPF3 has a transition band extending from 0.01290 Hz to 0.08387 Hz.

Estimating the efficiency as with the Decimation Embodiment, take a LPF passband ripple of 0.0087 dB and a stopband attenuation of 80 dB. Then LPF will have about 1250 taps and approximately 41 multiples per second (with a 1 Hz output sampling rate). The preferred embodiment has LPF1 with 128 taps and 0.4 multiplies per second; LPF2 has about 140 taps and approximately 14 multiplies per second; and LPF3 has 64 taps and approximately 6.4 multiplies per second. Thus the preferred embodiment three stage rate change filter agregates about 332 taps and 21 multiplies per second. This shows a storage efficiency of roughly 3.75 to 1 and a computational efficiency of roughly 2 to 1.

Rate Change Emdodiment

Figure 9:
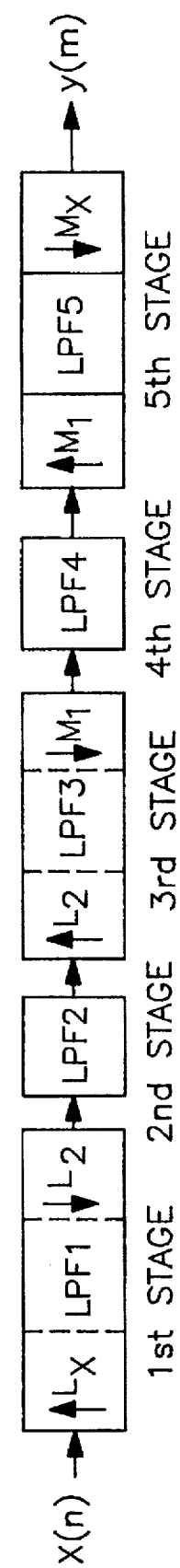
FIG. 9 shows a rate change embodiment.

A preferred embodiment rate change filter which changes the sampling rate by a factor of $L_X/M_X$ can be formed by combining a decimation embodiment with an interpolation embodiment. Placing the decimation embodiment before the interpolation embodiment would place the last sampling rate compressor of the decimation embodiment directly in front of the first sampling rate expander of the interpolation embodiment. These two operations, in general, cannot be combined and therefore no simplification of the architecture is possible. In contrast, if the decimation embodiment follows the interpolation embodiment, then the five stage architecture of FIG. 9 results instead of the expected six stages due to the combination of lowpass filter of the final stage of the interpolation embodiment with the lowpass filter of the first stage of the decimation embodiment to yield the new third stage. Generally, the first, third, and fifth stages are implemented as previously described in connection with FIG. 3.

This architecture can be further simplified when either the interpolation rate $L_X$ or the decimation rate $M_X$ is a composite number with near optimal factors; that is, when $L_X$ or $M_X$ would be its own phantom rate. Indeed, for $L_X$ factoring into $L_X$ times $L_2$, just replace the first two stages of FIG. 9 with a single $L_1$ sampling rate expander plus lowpass filter; this amounts to replacing the interpolation embodiment with the standard two-stage filter as previously observed. Similarly for $M_X$ factoring into $M_1$ times $M_2$ and the last two stages of FIG. 9. Further, if $L_X$ and $M_X$ are approximately the same size, then the design criteria on one filter can be altered slightly to eliminate the need for a subsequent filter.

As an illustrative example, assume a desired rate change factor $L_X/M_X$ of 31/61. The five stage architectural implementation is described as follows. The closest optimal phantom filter factors for the interpolate by 31 section are $L_1=3$ and $L_2=10$. The first sample rate expander expands the original sample rate by a factor of 31 to produce a new sample rate $F_1=31\ F_{IN}$.

The output of the first sample rate expander is filtered by LPF1. A shape factor of 1.25:1 is assumed. The transition band of LPF1 can be widened because the lower edge need only be compatible with the desired final output passband. Therefore the lower edge of the transition band is 0.006557 $F_1$. The upper edge of the transition band must be compatible with the required decimation by $L_2=10$. If we allow aliasing to the lower edge of the first image, the upper edge of the transition band lies at 2 times 0.05 $F_1-0.016129\ F_1=0.083871\ F_1$. The output of LPF1 is then passed to the first sample rate compressor to yield a sampling rate of $F_2$.

The transition band of LPF2 extends from 0.006557 $F_1$ to $F_{IN}/2$ or 0.016129 $F_1$. If one were to sharpen the transition band of LPF2 appropriately, LPF4 and LPF5 could be eliminated. This would however cause the complexity of LPF2 to approximately double. This becomes a design trade off. The design can be thought of as being analogous to going from an N stage filter implementation to a N plus K stage implementation to reduce the complexity of each stage. For the purpose of illustrating the five stage implementation in this example, we choose the transition band stated above.

The output of LPF2 is passed to the second sample rate expander which returns the sampling rate to $F_1$ and produces $L_2-1$ (=9)images. LPF3 preserves the desired final passband and eliminates the images produced by the sample rate expander. The transition band of LPF3 extends from a lower edge of 0.006557 $F_1$ to an upper edge of 0.083871 $F_1$. The signal is now at the desired interpolated rate and is ready to be decimated. Note that the upper edge of the signal of interest is consistent with the second sample rate compressor which follows LPF3.

As noted above, the phantom decimation rate for a decimation rate of 61 is 60. The two stage factors closest to optimal for 60 are 20 and 3. Thus the second sample rate compressor down samples by a factor of 20 to yield a sample rate designated $F_3$.

LPF4 is used to perform the spectral shaping on the final band of interest. An output shape factor of 1.25:1 is assumed with the upper edge of the transition band lying at the output folding frequency. The transition band of LPF4 extends from 0.013114 $F_3$=0.006557 $F_1$ to 0.16393 $F_S$=0.008197 $F_1$. Once the signal has been filtered, it is then passed to the third sampling rate expander where it is once again returned to the sampling rate $F_1$ with $M_1-1$ images.

LPF5 removes the images produced by the sampling rate expander. LPF5's transition band extends from 0.006557 $F_1$ to 0.041803 $F_1$. The lower edge of the transition band is the upper edge of the final passband and the upper edge of the transition band is the lower edge of the first image's transition band.

Once the images have been removed by LPF5 the signal is decimated by the desired decimation rate, 61, to yield an output signal with a sample rate of $F_{OUT}$ equal to 31/61 $F_{IN}$.

Figure 10C:
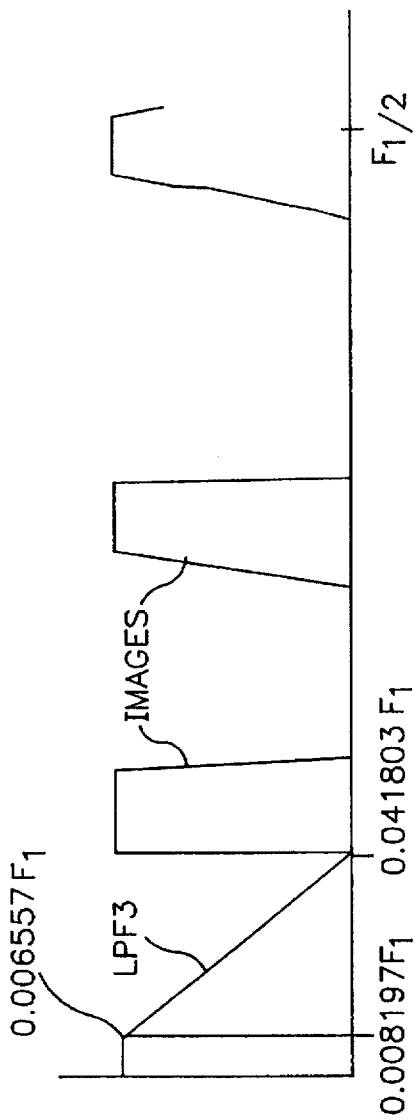

Another illustrative example. When the decimation rate and the interpolation rate are approximately (e.g., within 10%) equal, then further simplification may be available. For example, consider a rate change filter embodiment with $L_X/M_X$ equal to 59/61. The closest phantom rate for the interpolator is 60. The near optimal interpolation factors are 3 and 20. FIG. 10a shows the frequency domain representation of the signal after it has been sample rate expanded by 59 in the first sample rate expander so $F_1$ equals 59 $F_{IN}$. The resulting signal is then filtered, as shown in FIG. 10a by the heavy line, and decimated by 20 to produce a signal with spectral characteristics shown in FIG. 10b. Since the interpolated signal will ultimately be decimated by 61, the lower edge of LPF1's transition band lies at the upper edge of the final passband, or 0.006557 $F_1$ assuming a final shape factor of 1.25:1. The upper edge of the transition band has a worst case at $\frac{1}{40} F_1$ or 0.025 $F_1$ since $F_2$ is $F_1$ decimated by 20. The effect of using the decimated passband knee in this filter relaxes the filter shape and as will be seen later helps to eliminate a later filter.

LPF2 filters the decimated output of LPF1 which has a sampling rate $F_2$. The filtering process is shown for two cases in FIG. 10b. In both cases the lower transition band edge is identical to the one selected in LPF1. The heavy solid line shows a filter with the stop band beginning (upper edge of the transition band) at the point required to meet the interpolate by 59 constraint. The broken line shows a filter with the stop band beginning (upper edge of the transition band) at the point required to meet the decimate by 61 constraint. While the decimate by 61 constraint puts a slightly more severe design constraint on the filter than does the interpolate by 59 constraint, it eliminates the need for the decimation shaping filter, LPF4. It also eliminates the need for LPF5. The discussion of this example will continue by using the more severe LPF2 filter constraint. Keep in mind that similar hardware savings can be gained when the decimation and interpolation factors are close but the interpolation factor requires the more severe constraint. In addition, when the interpolation portion of the operation requires the more severe constraint, then in general filters LPF4 and LPF5 can be eliminated independent of the relative size relationship of the interpolation and decimation rates. This is true whether or not the rates are prime numbers.

Figure 10D:
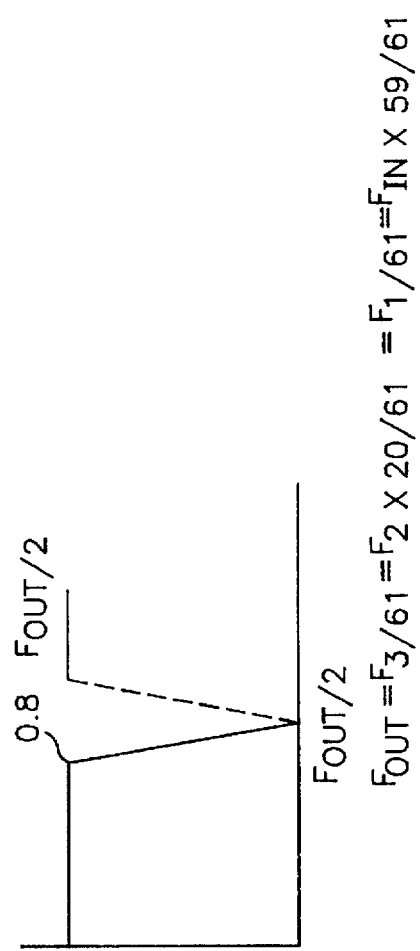

After the signal is filtered by LPF2 it is passed through the second sample rate expander to return the sampling rate to $F_3$ which equals $F_1$ and LPF3 is used to reject the resulting images. This operation is shown spectrally in FIG. 10c. The transition band of LPF3 is shown by the diagonal line. Once LPF3 filters the signal, the second sample rate compressor can decimate the signal by 61 since the signal has already been filtered consistent with that decimation rate. The spectral representation of the resulting output is shown in FIG. 10d.

Figure 11:
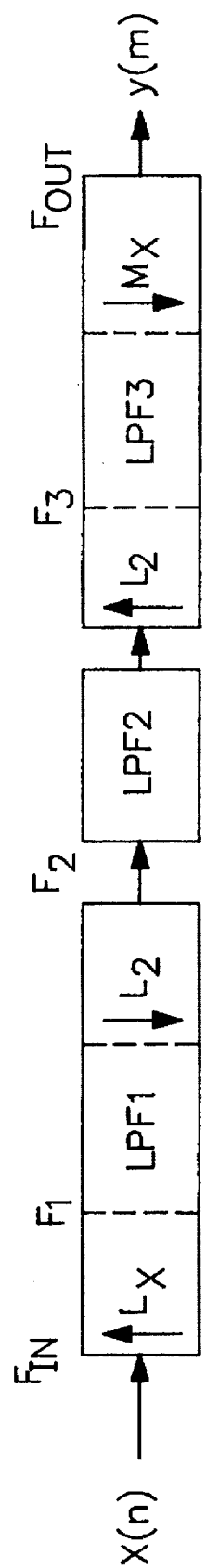
FIG. 11 shows a special case embodiment.

The resulting architecture is shown in FIG. 11. Please note that this architecture is applicable for composite number interpolation rates, composite number decimation rates, or both as well.

Generalized Rate Change Architecture

The more stages implemented requires more interface and control which cancels some of the computational and storage benefits gained; thus the trade off is more subtle than just comparing the computational and storage requirements. Also, passband ripple can be additive. Thus as the number of stages increases, the requirements on the passband ripple of each stage increases for a given aggregate passband ripple. Again, this cancels some of the efficiency gained by applying the multistage approach.

What is claimed is:

1. A multi-portion digital sample rate change filter, comprising:
   a signal input which receives a first input signal at a first input sample rate;
   at least two sample rate change portions, one of said two sample rate change portions being an interpolation portion and the other of said two sample rate change portions being a decimation portion, said two sample rate change portions being serially connected, and one of said two sample rate change portions also being a processing portion comprising:
      a portion of the multi-stage digital rate change filter comprising:
         a signal input component which receives a portion input signal at a portion input sample rate, the portion input signal being a function of the first input signal;
         an output sample rate shifting component which shifts the input sample rate of the portion input signal to a predetermined portion final output sample rate;
         a filtering component which has an input signal sample rate and an output signal sample rate which are approximately equal and which filters the portion input signal, said filtering component having multiple stages;
         wherein said filtering component and said output sample rate shifting component are serially connected and receive the portion input signal from said signal input component and provide a filtered portion output signal at the predetermined portion final output sample rate, and
         wherein the portion output signal from said processing portion is provided at an output sample rate which is a multiple of the portion input sample rate, the multiple having a numerator and a denominator, one of the numerator and denominator being equal to one, and the other of the numerator and denominator being one of a composite number and a prime number;
   and a signal output which provides a signal output from the multi-portion digital sample rate change filter that is a function of the portion output signal at an output sample rate which is a multiple of the input sample rate.

2. A sample rate change filter according to claim 1 wherein said filtering component comprises:
   an input signal receiving stage which receives a second signal at a second signal sample rate that is a function of the portion input signal;
   a decimation stage which decimates the second signal at a predetermined decimation rate based on optimization equations;
   a shaping filter stage which determines the final output passband shape of the second signal;
   an interpolation stage which interpolates the second signal at a predetermined interpolation rate based on the optimization equations; and
   an output signal providing stage which provides an output signal from said filtering component which has a sample rate that is approximately equal to the sample rate of the second signal.

3. A sample rate change filter according to claim 2 wherein the predetermined decimation rate and the predetermined interpolation rate are equal and wherein the input sample rate of the second signal and the output sample rate of the second signal are equal.

4. A sample rate change filter according to claim 2 wherein said decimation stage decimates the second signal at an integer compression rate, M, which imposes an optimal decimation rate change factor, $M_1$, according to:

$$M_1 = 2M/[(2-\Delta f) + (M\Delta f(2-\Delta f))^{0.5}] \tag{1}$$

wherein $\Delta f = (Fs-Fp)/Fs$, and wherein Fs is equal to a lower edge stopband frequency, and Fp is equal to an upper edge passband frequency, and wherein factors of M, $M_1$ and $M_2$, are near optimal with respect to the number of filter multiplications needed.

5. A sample rate change filter according to claim 2 wherein said interpolation stage interpolates the second signal at an integer expansion rate, L, which imposes an optimal interpolation rate change factor, $L_2$, according to:

$$L_2 = 2L/[(2-\Delta f) + (L\Delta f(2-\Delta f))^{0.5}] \tag{2}$$

wherein $\Delta f = (Fs-Fp)/Fs$, and wherein Fs is equal to a lower edge stopband frequency, and Fp is equal to an upper edge passband frequency, and wherein factors of L, $L_1$ and $L_2$, are near optimal with respect to the number of filter multiplications needed.

6. A sample rate change filter according to claim 1 wherein said output sample rate shifting component follows said filtering component such that the processing portion is a decimation portion.

7. A sample rate change filter according to claim 1 wherein said output sample rate shifting component precedes said filtering component such that the processing portion is an interpolation portion.

8. A multi-stage digital decimation filter comprising:

a signal input which receives an input signal at a first input sample rate;

a decimator which decimates the input signal at a first decimation rate based on optimization equations;

a shaping filter which shapes the decimated signal to a final output passband shape at the first decimation rate;

an interpolator which interpolates the shaped signal at the first decimation rate;

an output sample rate shifter which compresses the interpolated signal sample rate to a final output sample rate; and a signal output which provides the decimated signal at the final output sample rate from the decimation filter, wherein the final output sample rate is a multiple of the input sample rate, the multiple having a numerator equal to one and a denominator being one of a composite number and a prime number.

9. A multi-stage digital decimation filter according to claim 8 wherein said decimator decimates the input signal at an integer compression rate, M, which imposes an optimal decimation rate change factor, $M_1$, according to:

$$M_1 = 2M/[(2-\Delta f) + (M\Delta f(2-\Delta f))^{0.5}] \tag{3}$$

wherein $\Delta f = (Fs-Fp)/Fs$, and wherein Fs is equal to a lower edge stopband frequency, and Fp is equal to an upper edge passband frequency, and wherein factors of M, $M_1$ and $M_2$, are near optimal with respect to the number of filter multiplications needed.

10. A multi-stage digital interpolation filter comprising:

a signal input which receives an input signal at a first input sample rate;

an output sample rate shifter which expands the input signal sample rate to a final output sample rate;

a decimator which decimates the expanded signal at a first decimation rate based on optimization equations;

a shaping filter which shapes the decimated signal to a final output passband shape at the first decimation rate;

an interpolator which interpolates the shaped signal at the first decimation rate; and a signal output which provides the interpolated signal at the final output sample rate from the interpolation filter, wherein the final output sample rate is a multiple of the input sample rate, the multiple having a denominator equal to one and a numerator being one of a composite number and a prime number.

11. A multi-stage digital interpolation filter according to claim 10 wherein said interpolator interpolates the input signal at an integer expansion rate, L, which imposes an optimal interpolation rate change factor, $L_2$, according to:

$$L_2 = 2L/[(2-\Delta f) + (L\Delta f(2-\Delta f))^{0.5}] \tag{4}$$

wherein $\Delta f = (Fs-Fp)/Fs$, and wherein Fs is equal to a lower edge stopband frequency, and Fp is equal to an upper edge passband frequency, and wherein factors of L, $L_1$ and $L_2$, are near optimal with respect to the number of filter multiplications needed.

12. A multi-stage sample rate change filter having an overall sample rate change factor comprising:

a first filter portion being one of an interpolator portion and a decimator portion, said first filter portion being a multi-stage portion having a sample rate change factor which is one of an interpolation rate and a decimation rate, said first filter portion sample rate change factor being one of a composite number and a prime number such that filter efficiency of said first filter portion is near optimal;

a second filter portion being the other of an interpolator portion and a decimator portion in series with said first filter portion; and wherein the overall sample rate change factor of said multi-stage sample rate change filter has a numerator and a denominator which is controlled by said first filter portion such that if said first filter portion is an interpolator portion then the numerator is equal to one of a composite number and a prime number, and such that if said first filter portion is a decimator portion then the denominator is equal to one of a composite number and a prime number.

13. A multi-stage sample rate change filter according to claim 12 wherein the denominator of the overall rate change factor is equal to one of a composite number, the composite number not being factorable into near optimal factors, and a prime number.

14. A multi-stage interpolating rate change filter having an overall sample rate change factor having a numerator and a denominator comprising:

a first filter portion; and a second filter portion in series with said first filter portion, wherein the denominator of the overall sample rate change factor is equal to one, and the numerator of the overall sample rate change factor is one of a composite number, the composite number not being factorable into near optimal factors, and a prime number such that filter efficiency of said multi-stage interpolating rate change filter is near optimal.

15. A multi-stage decimating rate change filter having an overall sample rate change factor having a numerator and a denominator comprising:

a first filter portion; and a second filter portion, in series with said first filter portion, wherein the denominator of the overall sample rate change factor is one of a composite number, the composite number not being factorable into near optimal factors, and a prime number, and the numerator of the overall sample rate change factor is equal to one, such that filter efficiency of said multi-stage decimating rate change filter is near optimal.

16. A multi-stage sample rate change filter having an overall sample rate change factor comprising:

at least one filter portion being one of an interpolator portion and a decimator portion, said one filter portion being a multi-stage portion having a sample rate change factor which is one of an interpolation rate and a decimation rate, wherein the rate change factor is equal to one of a composite number, the composite number not being factorable into near optimal factors, and a prime number, such that efficiency of said one filter portion is near optimal.

17. A method of changing the rate of an input signal by a ratio of L/M where L and M are positive integers comprising the steps of:

(1) providing a digital input signal having a signal rate;

(2) interpolating said input signal by a factor of L;

(3) decimating said interpolated signal by a factor $L_2$, determined from L using optimization equations;

(4) interpolating said decimated signal by the factor $L_2$;

(5) decimating said interpolated decimated signal by a factor $M_1$, determined from M using optimization equations;

(6) interpolating said decimated interpolated decimated signal by the factor $M_1$ to provide a prefinal signal; and, (7) decimating said prefinal signal by a factor of M to provide an output signal.

18. The method of claim 17 further comprising the steps of shape filtering the signal between each step of interpolating and the succeeding step of decimating.

19. The method of claim 17 wherein one or more of L and M are prime numbers.

20. The method of claim 17 wherein L and M are composite numbers.

21. The method of claim 20 wherein $M_1$ and $L_2$ are not optimal factors.

* * * * *